(12) United States Patent
Schonleber

(10) Patent No.: US 6,270,585 B1
(45) Date of Patent: Aug. 7, 2001

(54) DEVICE AND PROCESS FOR TREATING SUBSTRATES IN A FLUID CONTAINER

(75) Inventor: Dietmar Schonleber, Römerstein (DE)

(73) Assignee: Steag Microtech GmbH (DE)

( * ) Notice: Subject to any disclaimer, the term of this patent is extended or adjusted under 35 U.S.C. 154(b) by 0 days.

(21) Appl. No.: 09/171,762
(22) PCT Filed: Mar. 26, 1997
(86) PCT No.: PCT/EP97/01528
§ 371 Date: Mar. 19, 1999
§ 102(e) Date: Mar. 19, 1999
(87) PCT Pub. No.: WO97/40522
PCT Pub. Date: Oct. 30, 1997

(30) Foreign Application Priority Data

Apr. 22, 1996 (DE) .............................. 196 15 970
Jan. 31, 1997 (DE) .............................. 197 03 646

(51) Int. Cl.[7] ................. B08B 3/00; B08B 3/04
(52) U.S. Cl. ............... 134/32; 134/25.1; 134/25.5; 134/135; 134/902
(58) Field of Search ................ 211/41.18, 41.17; 134/135, 902, 32, 1.3, 2, 25.1, 25.5

(56) References Cited

U.S. PATENT DOCUMENTS 5,096,457 * 3/1992 Nakagawa et al. ............. 8/506
5,488,964   2/1996 Murakami et al. .
5,672,212 * 9/1997 Manos ......................... 134/1.3

FOREIGN PATENT DOCUMENTS 4413077  10/1995 (DE) .
0523836   1/1993 (EP) .

* cited by examiner

Primary Examiner—Alexander Markoff
(74) Attorney, Agent, or Firm—Robert W. Becker & Associates

(57) ABSTRACT

A method and apparatus for handling substrates in a fluid container are provided. Even large substrates receive a particularly reliable support by means of at least one support strip that can be placed upon the upper edge portion of the substrates, and in particular in such a way that the support strip does not come into contact with treatment fluid in the tank.

7 Claims, 1 Drawing Sheet

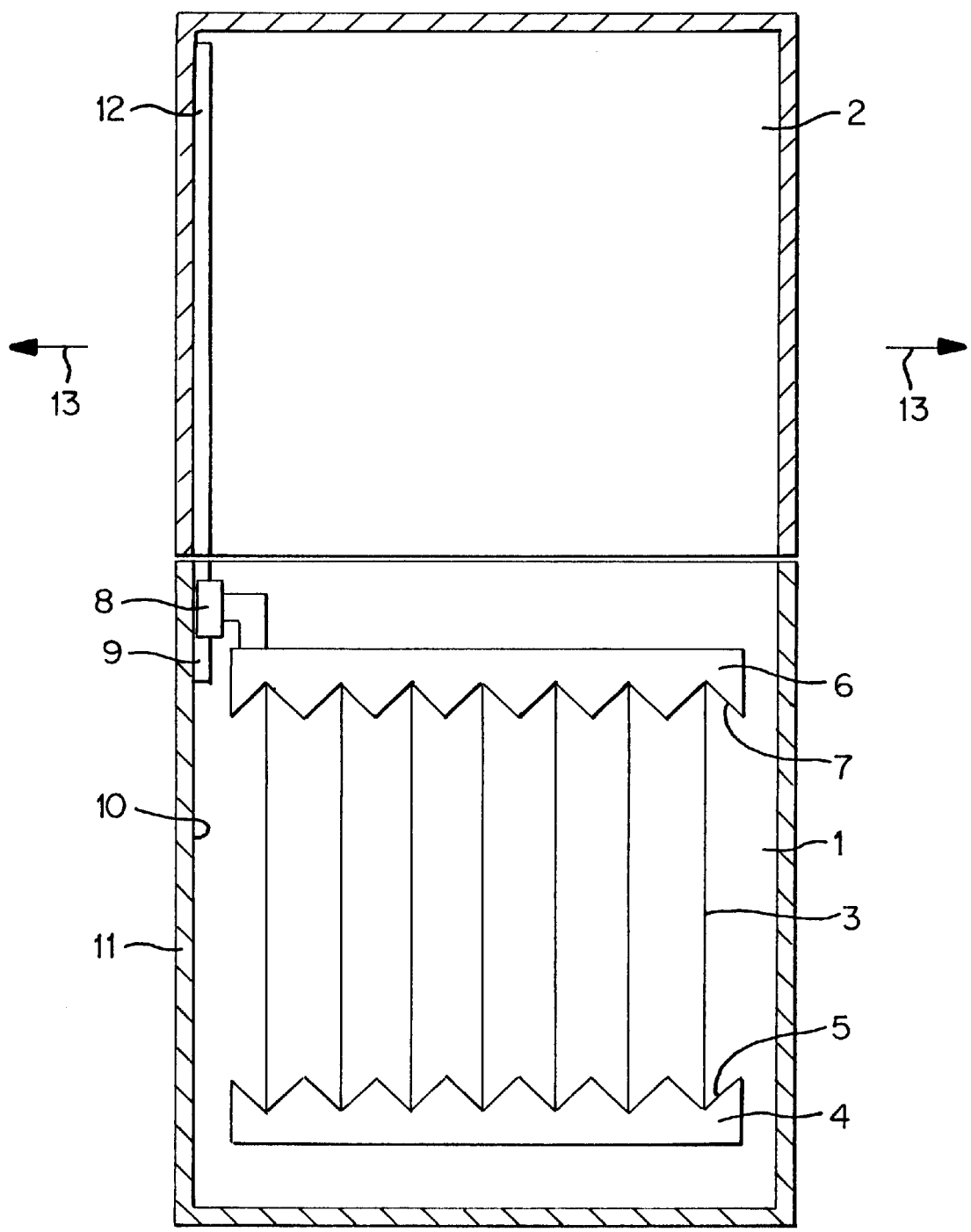

DEVICE AND PROCESS FOR TREATING SUBSTRATES IN A FLUID CONTAINER

BACKGROUND OF THE INVENTION

The present invention relates to an apparatus and a method for handling substrates in a fluid tank in which the substrates can be placed at a distance from one another as sets, whereby a support strip can be placed on the upper edge region of the substrates. With apparatus as they are known, for example, from EP-B-0 385 536, U.S. Pat. No. 5,265,184, or DE-A-44 13 077 that originates with the applicant of this application, the substrates are held by a substrate-receiving apparatus in the fluid tank or in a substrate holder either by means of a 3-point support or with a 1-point support and additional guide slots on the inner sides of the tank wall or slots in the walls of a hood. In the case of the 3-point support, the support of the substrates is limited to a narrow edge region on the underside of the substrates. Especially with the processing of large wafer dimensions or diameters, for example of 300 mm, such a support is, however, not reliable, since it is not possible to rule out that at least in the upper region, which is remote from the support, the wafers rest against one another, so that the rate of rejection is great. The contacting of adjacent substrates is particularly enhanced during removal of the wafers from the fluid due to the capillary action between the wafers. The use of guide slots and side holders in the fluid tank, or in a hood that is disposed above the fluid tank, has the drawback that the manufacturing costs for the tank and/or the hood are considerably greater. Furthermore, such slots adversely affect a flow of the treatment fluid in the tank that is as uniform and free of disruption as possible. Guide slots furthermore make it more difficult to clean and dry the tank and hood. However, even with the use of guide slots in the drying hood, especially for substrates having large dimensions, the introduction of the substrates into the slots is not ensured, especially due to the capillary action between the substrates that are raised out of the treatment fluid, so that as a consequence damage to the substrates can occur.

A further drawback of the known arrangements is that when the fluid flows rapidly into the tank below the substrates, there exists the danger that the substrates will be raised or will float. Thus, the reliable, parallel and spaced support of the substrates in the substrate-receiving apparatus, or in a substrate carrier, is not guaranteed.

U.S. Pat. No. 5,488,964 A1 discloses an apparatus of the aforementioned type where during the treatment in the fluid tank a rod or a plate is placed upon flat regions of the substrates in order to prevent the substrates from floating up. This rod or plate is first pivoted over the substrates via a drive mechanism when they are introduced into the fluid tank. Prior to removal of the substrates from the fluid tank, the rod or plate is again pivoted away in order to be able to remove the substrates from the fluid tank. Such an arrangement is very expensive and complicated, and more space is required over the fluid tank, especially with respect to the pivoting action. Furthermore, during the loading and unloading process, the substrates are not held by this rod or plate, so that the danger exists that the substrates can rest against and contact one another. It is an object of the present invention to provide an apparatus and method of the aforementioned type with which even substrates having large dimensions can be reliably supported during the processing and/or during the introduction and removal into or from the fluid tank.

SUMMARY OF THE INVENTION

The stated object is inventively realized in that the support strip rests upon or remains resting upon the substrates during the introduction and/or removal process, i.e. during the loading and/or unloading process. In this way, support is also provided in the upper region for the substrates, so that the danger of contact of the substrates or wafers during processing in the fluid tank or during introduction and removal is avoided, and in particular especially also for wafers having large dimensions. Furthermore, also during rapid fluid introduction from below, or where strong introduction nozzles are used, it is not possible for the substrates to be raised or to float up. Due to the presence of the support strip, guide slots are no longer required in or on the tank wall and/or in or on the hood wall, so that the manufacturing costs of the inventive apparatus are less, a disadvantageous effect upon the fluid flow is avoided, and cleaning of the tank is simplified.

Pursuant to a very advantageous specific embodiment of the invention, the support strip can preferably be displaced vertically in a guide means that is provided in the fluid tank and/or a tank hood. In this connection, the guide means can, for example, be a rail that is vertically disposed on a tank wall and/or on a hood wall. Gliding in or on this rail is a support slide that is connected by an angular element with the horizontally disposed support strip.

The support strip preferably rests upon the substrate edges by virtue of its own weight. For this purpose, pursuant to a further specific embodiment of the invention, the weight and/or the material of the support strip is selected in conformity with the desired bearing weight of the support strip upon the substrates. When a guide rail is used for the vertical displacement of the support strip, the support strip, preferably together with the substrate set, can be lowered or raised without it being necessary to provide a drive mechanism just for the support strip.

For specialized applications, however, it can also be advantageous to move the support strip independently from the raising or lowering of the substrates. For this case, the support strip is connected by appropriate connecting elements with a drive mechanism, for example a stepping motor or a driver that is connected with the drive mechanism of the substrate-receiving apparatus, or the like.

The support strip preferably extends over the entire width of the substrate set, so that it supports all of the substrates of the set.

Pursuant to one advantageous specific embodiment of the invention, the support strip, on that side that faces the substrates, is provided with recessed portions, for example notch like slots or slots that narrow in the manner of a V-shape, in which the substrates rest. The recessed portions ensure a reliable retention of the substrates and prevent an alteration of their position relative to one another. Also when great capillary forces occur between the substrates, these substrates remain upright in the set and parallel one after the other, and are reliably spaced from one another. This avoids contact between the substrates, on which also the drying process is possible only with great difficulty and particle danger exists.

Pursuant to a further specific embodiment of the invention, the distances between the recessed portions are selected in conformity with the provided spacing between the substrates, so that in conformity with the spacing selection of the recessed portions of the support strip, the spacing of the substrates relative to one another in the substrate set is fixed. If receiving slots having a defined spacing relative to one another are also found in the substrate-receiving apparatus of the tank and/or in the substrate holder, for instance a substrate carrier, then the spacing of the recessed portions of the support strip are preferably selected in conformity with the spacings of the slots. With regard to the configuration of the receiving apparatus and/or slots for receiving the substrates in fluid tanks or in the substrate carrier, reference is made in particular to the not prepublished DE-A-1 95 46 990, DE-A-1 96 15 108, as well as DE-A-44 28 169 of the same applicant, the content of which to this extent is incorporated in the present application.

For a reliable, defined support of the substrates, be they disk-shaped or rectangular substrates, three points are required. By using a support strip, preferably at the highest point of the substrate edge, a support point is defined, so that two further support points in the substrate-receiving apparatus of the fluid tank or of the substrate carrier suffice, and guide slots in the tank and/or hood walls are not necessary. Examples of substrate-receiving apparatus having at least two support points are described, for example, in the previously mentioned DE-A-44 13 077 as well as in the not prepublished DE-A-195 46 99 and DE-A-196 15 108, the contents of which, in order to avoid repetition, are incorporated by reference into this application.

Pursuant to one particularly advantageous specific embodiment of the invention, at least two support strips are provided that, spaced from one another, can be placed upon the upper edge portions of the substrates or of the substrate set. In this way, the at least two support strips already define two support points, so that the substrate-receiving apparatus in the fluid tank merely has to provide one support point, which is preferably a blade-like edge that is provided for raising the substrates. With this embodiment, no further support points are required in the fluid tank, so that the fluid tank can be made small and hence requires only a small fluid volume, thus making it economical to manufacture, and with the simplest means enabling a reliable support of the substrates during the substrate handling and during the introduction and withdrawal.

Pursuant to a further very advantageous specific embodiment, especially in conjunction with a drying process, in other words when the substrates are raised out of a processing fluid, such as a rinsing fluid, for the drying process, the support strip or strips do not rest upon the substrates when they are immersed in the treatment fluid. Rather, the support strip or strips is or are held at a prescribed distance, which is preferably 3 to 20 mm, above the surface of the treatment or rinsing fluid, so that the support strip does not come into contact with the fluid, and is also held above the fluid surface by such a distance that no spray or drops can reach the support strip. Since during removal of the substrates from the fluid adhesive forces occur between the fluid and the substrates, and a water film is drawn upwardly due to capillary action between the substrates, the strip should remain 2 to 20 mm over the fluid surface in order not to become wet. The support strip thus waits at the prescribed distance above the fluid surface for the substrates that are to be raised out of the fluid tank. As the substrates are raised further, the support strip or strips are then raised along with the substrates.

Proceeding from the initially mentioned process, the stated object is realized by a method where the support strip, during at least a portion of the introduction and/or removal process, i.e. at least a portion of the loading and/or unloading process of the substrates, is placed upon these substrates. The thus achieved advantages correspond to those previously mentioned in conjunction with the inventive apparatus.

Pursuant to a particularly advantageous specific embodiment, especially in conjunction with the drying of the substrates after a treatment or rinsing process, the following method steps are provided:

a) introduction of the substrates into the fluid tank;
b) treatment of the substrates in the fluid tank;
c) raising of the substrates out of the fluid tank;
d) placement of a supports trip (6) upon the upper edge regions of the substrates that have already been raised out of the treatment fluid, and
e) further raising of the substrates together with the support strip.

This method ensures that the support strip itself does not come into contact nor is wetted with the treatment or rinsing fluid, the result of which would be that the substrates could not at all or only at great effort be reliably dried. Nevertheless, due to the support strip that is available and waiting above the fluid surface, the substrates, after leaving the treatment fluid, in other words when they are already dry, are provided with a support, thus preventing the wafers from being drawn together and contacting one another. The tendency for the substrates to approach and contact one another, especially as they exit the treatment fluid, is effected by forces that occur due to the capillary action of the water between the substrates.

The placement of the support strip upon the edge regions of the substrates that are raised out of the treatment fluid is preferably effected by a relative movement between the support strip and the substrates, whereby in particular the support strip waits at a prescribed distance above the fluid surface, and the substrates are raised from below to the waiting support strip.

It is advantageous, especially if the hood, which pursuant to the Marangoni process is preferably flooded with a fluid, for example alcohol-containing nitrogen, that accelerates and improves the drying process, is provided with guide means in or on inner walls for the substrates, to withdraw or space the support strip from the substrates, for example via a further raising, when the substrates are introduced into the guide means and are held therein. In the case of hoods having guide slots, the support strip is thereupon no longer required and could even be a drawback.

The guide slots of the hood should only extend downwardly to such an extent that they do not come into contact with the fluid. The substrates, in a region above the fluid surface where the forces that occur between the substrates due to the capillary action of the water is the greatest, are therefore spaced by a defined distance from one another via the support strip until the substrates reliably enter the guide slots of the hood and are subsequently held by such slots.

It is also possible to utilize the support strip during the introduction of the substrates into the fluid tank by placing the support strip upon the substrates during the loading process.

However, this is not necessary if the substrates are introduced into the fluid tank together with a substrate holder, a so-called carrier, and are raised out of the substrate carrier and out of the fluid tank only during the drying process.

It is to be understood that the term substrates refers not only to wafers, but also to other plate or disk-shaped components, such as CDs, masks, LED indicator boards, or the like.

BRIEF DESCRIPTION OF THE DRAWING

The invention will subsequently be explained with the aid of one preferred exemplary embodiment in conjunction with a single schematic drawing.

DESCRIPTION OF PREFERRED EMBODIMENTS

Disposed above a fluid container or tank 1 is a hood 2, which serves for example for the drying of substrates 3, as described in DE-A-44 13 077 or the not prepublished document DE-A-195 00 239 or DE-A-196 15 108 of this applicant.

Disposed in the fluid tank 1 is a substrate-receiving apparatus 4 that is provided with slots or notches 5 in which stand the schematically indicated substrates 3. Since the configuration of the substrate-receiving apparatus 4 is not the subject matter of the present invention, the same will not be explained here and reference is therefore made to the aforementioned DE-A-44 13 077, DE-A-195 46 990 and DE-A-196 15 108.

A retaining or support strip 6 is disposed on the upper side of the substrates 3. The support strip 6 also has recessed portions in the form of notches or V-shaped slots 7 in which the upper edges of the substrates 3 are supported. The support strip 6 ensures a reliable support of the substrates 3 in an upright, parallel position and prevents the contact of the wafers, even at large dimensions and a high attractive force due to capillary action, especially at a high packing density, i.e. at small spacing.

In the illustrated embodiment, the support strip 6 is connected to a support slide 8 that glides in or on a rail 9 that is mounted on or formed on an inner side 10 of a fluid wall 11 of the fluid tank 1. In the hood 2, the rail 9 continues in an upper rail portion 12 that is embodied in a manner corresponding to the rail 9 of the fluid tank 1.

After the wafers 3 have been treated in the fluid tank 1 they are raised for drying in the hood 2 by raising the substrate-receiving apparatus 4 together with the support strip 6 that rests upon the substrates 3. In so doing, the support slide 8, which is fixedly connected to the support strip 6, glides upwardly on the rail 9 of the fluid tank 1 and the upper rail portion 12 in the hood 2 and also during this procedure provides a reliable support of the substrates 3.

After conclusion of the drying process, the wafers are lowered into a non-illustrated wafer holder or carrier that is disposed in the fluid tank 1. The hood, together with the support strip 6 that is at the upper end of the hood 2, are displaced to the side as indicated by the arrow 13. As a result, the wafers 3 are freed not only from the hood but also from the support strip 6, so that they can be loaded and unloaded.

The present invention was previously explained with the aid of one preferred exemplary embodiment. However, for one having skill in the art a number of modifications and embodiments are possible without thereby deviating from the inventive concept. For example, it is possible to provide a rail for shifting the support strip 6 only in the hood 2, whereby the support slide 8, which glides on the rail 12 of the hood 2, is connected to the support strip 6 by means of a retainer element that in the closed state of the hood extends into the fluid tank 1 to such an extent that the support strip 6 rests upon the substrates 3 even in the lowermost position of the substrates. Very advantageous is also a specific embodiment, especially in conjunction with the drying process, with which the support strip does not come into contact with the treating or drying fluid, but rather waits above the fluid surface until it engages the substrates during lifting of the same out of the treatment fluid, whereupon it holds the substrates in a position parallel to one another.

A further exemplary embodiment would be to move the support strip 6 into any desired position independently of the movement of the substrate-receiving apparatus 4 by means of its own drive mechanism, such as a stepping motor. In addition, the guide and movement elements for raising and lowering the support strip could be embodied in conformity with existing conditions. In order not to adversely affect the flow conditions in the fluid tank 1 or in the hood 2 by a rail 9 or 12, a specific embodiment is conceivable where the rail is integrated into the wall of the fluid tank 1.

The present invention is, of course, in no way restricted to the specific disclosure of the specification and drawings, but also encompasses any modifications within the scope of the appended claims.

What is claimed is:

1. A method of handling substrates in a fluid tank that contains a treatment fluid, said method including the steps of:

placing said substrates, which are spaced from one another, as sets into said fluid tank;

treating said substrates in said fluid tank after said placing step;

during raising and/or lowering of said substrates out of or into said fluid tank, disposing a support strip upon an upper edge of said substrates, which upper edge extends out of said treatment fluid, such that said support strip does not come into contact with said treatment fluid;

initiating raising of said substrates out of said fluid tank, wherein said step of disposing a support strip comprises disposing said support strip upon said upper edge of said substrates that has already been raised out of said treatment fluid; and continuing to raise said substrates, together with said support strip.

2. A method according to claim 1, wherein said step of disposing said support strip take place during raising of said substrates while said support strip awaits their arrival.

3. A method according to claim 1, which includes the step of separating said support strip from said substrates if said substrates are held in guide means disposed in a hood.

4. A method according to claim 1, wherein said support strip rests upon said substrates during said placement thereof into said fluid tank.

5. A method according to claim 1, which includes the step of placing said substrates into said fluid tank together with a substrate carrier.

6. A method according to claim 1, which includes the step of placing said support strip a prescribed distance over a surface of said treatment fluid, and during removal of said substrates from said treatment fluid raising said support strip along with said substrates.

7. A method according to claim 6, wherein said prescribed distance between said surface of said treatment fluid and said support strip is from 3 to 20 mm.

* * * * *

UNITED STATES PATENT AND TRADEMARK OFFICE
CERTIFICATE OF CORRECTION

PATENT NO. : 6,270,585 B1
DATED : August 8, 2001
INVENTOR(S) : Schönleber

It is certified that error appears in the above-identified patent and that said Letters Patent is hereby corrected as shown below:

<u>Title page,</u>
Item [54] should read as follows:
-- [54] Title: APPARATUS AND METHOD FOR HANDLING SUBSTRATES IN A FLUID TANK --

Signed and Sealed this

Sixth Day of August, 2002

*Attest:*

*Attesting Officer*

JAMES E. ROGAN
*Director of the United States Patent and Trademark Office*